United States Patent [19]

Chu

[11] 3,984,770
[45] Oct. 5, 1976

[54] FREQUENCY MEASUREMENT USING PHASE CONTINUOUS FREQUENCY SWITCHING

[75] Inventor: David C. Chu, Woodside, Calif.

[73] Assignee: Hewlett-Packard Company, Palo Alto, Calif.

[22] Filed: Feb. 5, 1975

[21] Appl. No.: 547,282

[52] U.S. Cl. .............................. 324/82; 324/83 D; 328/140; 235/151.31
[51] Int. Cl.² ......................................... G01R 23/00
[58] Field of Search ................. 324/78 D, 78 R, 82, 324/83 D; 328/15, 16, 138, 140; 307/295, 233

[56] References Cited
UNITED STATES PATENTS 3,391,343   7/1968   McCurdy ............................ 324/82

Primary Examiner—R. V. Rolinec
Assistant Examiner—Michael J. Tokar
Attorney, Agent, or Firm—David A. Boone

[57] ABSTRACT

An automatic transfer oscillator system for frequency measurement using a single sampler is described. Two signals, of frequencies $f_1$ and $f_2$, are alternately used to drive the sampler. The two frequencies are sufficiently close by design so that the intermediate frequency signals generated arise from the same harmonic number when sampling a signal of unknown frequency $f_x$. The resulting average IF output is accurately measured and used to compute the unknown frequency $f_x$. Accurate measurement of the average IF output is made possible because the transition between $f_1$ driving the sampler and $f_2$ driving the sampler only occurs when the two signals are in phase. As a result, the IF signal transitions are also in phase and spurious signals are not produced. This technique is referred to as phase continuous switching.

11 Claims, 3 Drawing Figures

FREQUENCY MEASUREMENT USING PHASE CONTINUOUS FREQUENCY SWITCHING

BACKGROUND AND SUMMARY OF THE INVENTION

Certain known frequency measurement techniques use the transfer oscillator sampling approach and require two samplers. (See, for example, U.S. Pat. No. 3,836,758 entitled Wide Frequency Range Counter System Utilizing Automatic Range Searching and Loop Compensation issued on Sept. 17, 1974 and the Hewlett-Packard Journal, May 1974.)

The present invention requires only one sampler which is alternately driven by two signals of frequencies $f_1$ and $f_2$, which are sufficiently close by design to ensure both IF frequencies output by the sampler have the same harmonic number, satisfying the equations, $$f_x = Nf_1 - IF_1$$

$$f_x = Nf_2 - IF_2.$$

Measurement of the sampler output $\bar{f}$ using the phase continuous switching technique then yields an accurate weighted average of the IF frequencies from which $f_x$ may be calculated.

Phase continuous switching is defined as the technique where the transition from $f_1$ as the driving frequency of the sampler to $f_2$ as the driving frequency or vice versa is done only when the two frequencies $f_1$ and $f_2$ are in phase. A mixer is employed to supply the difference frequency $f_2 - f_1$ as the trigger source for the transitions between $f_1$ driving the sampler and $f_2$ driving the sampler.

The technique of phase continuous switching facilitates accurate measurement of the IF output while alternating rapidly between the two driving frequencies $f_1$ and $f_2$. Using a single sampler system without this ability, one had to measure the IF frequency through multiple gating (to avoid the spurious counts which occur when switching at random phase), and thereby introduced quantization error as well as repeated systematic gating errors. Alternatively, one had to switch frequencies between long intervals to allow time for sufficiently accurate measurement of each IF frequency. The latter approach requires that the input frequency must be sufficiently free from frequency drift and modulation to allow accurate results to be obtained from long periods of measurement time.

DESCRIPTION OF THE PREFERRED EMBODIMENT

Figure 1:
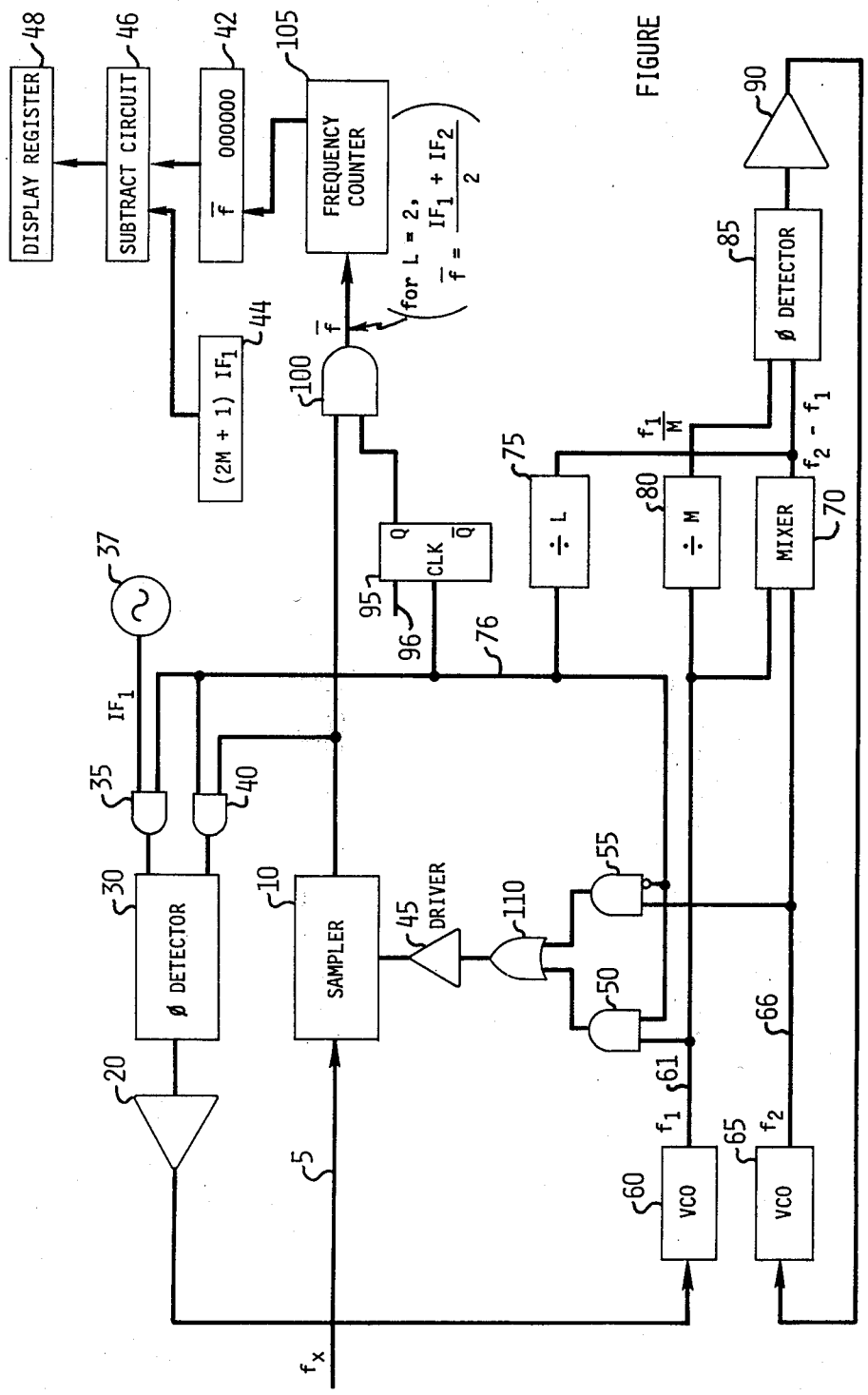
FIG. 1 is a schematic diagram of a frequency measurement system according to one embodiment of the invention.

Referring to the diagram of FIG. 1, there is shown a signal 5 of unknown frequency $f_x$ input to sampler 10. Sampler 10 is alternately driven by signals 61 and 66 of frequencies $f_1$ and $f_2$ provided by tunable oscillators 60 and 65. Alternating between the two signals is controlled by the difference frequency applied by mixer 70 through divider 75 to gates 50 and 55.

An input phase lock loop is provided when $f_1$ is enabled by divider 75 which tunes $f_1$ through phase detector 20 until the sampler 10 output is locked to a known frequency signal from signal generator 37. A second phase lock loop tunes oscillator 65 through phase detector 85, until $f_2$ is locked to $f_1$ within a desired offset.

Measurement of the average frequency $\bar{f}$ output by sampler 10 is accomplished by frequency counter 105 when gate 100 is enabled. The measured value for $\bar{f}$ and the known value of the frequency output by signal generator 37 are sufficient to calculate $f_x$.

When $f_1$ 61 is driving the sampler it is phase locked to the input signal 5 in the following manner. The IF output of sampler 10 is applied to phase detector 30 through gate 40 which is enabled by signal 76. The generation of signal 76 is discussed below. The other signal applied to phase detector 30 through gate 35 is an IF signal of known frequency from signal generator 37. The output of phase detector 30 is coupled to dc amplifier circuit 20 which tunes voltage controled oscillator 60 to a frequency $f_1$ that brings the phase lock loop to the locked condition $$f_x = Nf_1 - IF_1. \quad (1)$$

The generation of $f_2$ is accomplished as follows. Signal 61 is applied to divider 80 and the resulting output is applied to phase detector 85. The other signal applied to phase detector 85 is the difference frequency from mixer 70. The output of phase detector 85 is applied to loop filter amplifier 90 which tunes voltage controlled oscillator 65 to effect the following relationship $$f_2 - f_1 = \frac{f_1}{M} \quad (2)$$

and therefore $$f_2 = f_1 \left(1 + \frac{1}{M}\right) \quad (3)$$

Mixer 70 outputs the difference frequency, $f_2 - f_1$. Specific transitions of this difference frequency signal indicate when $f_1$ 61 and $f_2$ 66 are in phase. These transitions are used to clock divide by L circuit 75 causing signal 76 to change logic states only when $f_2$ and $f_1$ are in phase. Responding to signal 76, gates 50 and 55 alternately provide $f_1$ 61 then $f_2$ 66 as the sampling frequency. When signal 76 is in the logical 1 state, gate 50 selects signal 61 as the sampling frequency and gates 35 and 40 enable the input phase lock loop to tune voltage controlled oscillator 60 until the sampler output is locked to the $IF_1$ output from signal generator 37. When signal 76 is in the logical zero state, $f_2$ 66 is provided as the sampling frequency through gate 55. Gates 35 and 40 are disabled so that phase detector 30 is not operating to tune voltage controlled oscillator 60 which coasts at the last frequency determined by the input phase lock loop.

When $f_2$ 66 is utilized as the sampling frequency the following equation is true $$Nf_2 - f_x = IF_2 \quad (4)$$

where N is the same harmonic number present when $f_1$ 61 is the sampling frequency.

Assuming L=2 for divider 75 (in which case $f_1$ and $f_2$ drive the sampler during equal time periods), the average frequency output by the sampler may be expressed as $$\overline{f} = \frac{IF_1 + IF_2}{2} \qquad (5)$$

Accurate measurement of $\overline{f}$ is facilitated by the phase continuous switching technique of the present invention which ensures a smooth transition between the two sampling signals, thereby also ensuring a smooth transition between the two IF frequencies output from the sampler. Therefore, the measured value of the IF output will not contain spurious counts generated at the frequency transitions.

Calculations below indicate the derivation of the equation whereby $f_x$ can be computed from the measured value for $\overline{f}$. Taking the equation $Nf_1 - f_x = IF_1$ and multiplying it by $1 + 1/M$ and substituting the solution for $f_2$ in equation (3) into the equation $Nf_2 - f_x = IF_2$ allows one to express $f_x$ in the following equations.

$$Nf_1 (1 + \frac{1}{M}) - f_x (1 + \frac{1}{M}) = IF_1 (1 + \frac{1}{M}) \qquad (6)$$

$$Nf_1 (1 + \frac{1}{M}) - f_x = IF_2 \qquad (7)$$

$$f_x = M(IF_2) - (M + 1) IF_1 \qquad (8)$$

$f_x$ is therefore expressed in an equation with only one unknown, i.e., $IF_2$ since $IF_1$ and M are determined by design. (It is not convenient to measure $IF_2$ directly since that frequency only occurs periodically. However, $\overline{f}$ can be measured accurately as described below.)

Solving the equation $$\overline{f} = \frac{IF_1 + IF_2}{2}$$

yields $$IF_2 = 2\overline{f} - IF_1 \qquad (9)$$

$f_x$ can therefore be expressed as $$f_x = 2M\overline{f} - (2M + 1) IF_1 \qquad (10)$$

Again referring to FIG. 1, measurement of $\overline{f}$ is begun when the measurement enable signal 96 is present and signal 76 sets D flip-flop 95 which enables gate 100. Measurement of $\overline{f}$ will end on the strobe of flip-flop 95 by signal 76 which next follows the removal of the measurement enable signal 96. Use of flip-flop 95 ensures that the measurement of $\overline{f}$ will begin and end on the enabling of signal 61 to drive the sampler. Therefore, equal time periods of $IF_1$ and $IF_2$ will be counted by frequency counter 105 when L=2 for divide by L circuit 75. For other values of L, the position of $IF_1$ and $IF_2$ depends on the counting code of divide by L circuit 75. For example, for L=3 it is possible that $f_1$ may drive the sampler twice as long as $f_2$ or vice versa. For these unequal weight cases, equation (5) should be modified accordingly.

Measurement is enabled by providing signal 96 after the phase lock loops have settled down to a reasonable quiescent state so that any initial gyrations during lock acquisition will not appear within the measurement phase.

After the measurement of $\overline{f}$ is completed, calculation of $f_x$ can be accomplished by digital processing. The contents of register 105 stored in the most significant bits of register 42, shifted enough from the least significant bit to effectively multiply $\overline{f}$ by the constant 2M. (M, in this embodiment, has been conveniently selected to be a number which is a power of two, such as 32, 64, 128, etc., to allow multiplication by shifting the appropriate number of places.) A constant having the value (2M+1) $IF_1$ contained in register 44 is subtracted from the contents of register 42 to provide the calculated value for $f_x$ to display register 48. Subtract circuit 46 is similar to the SN74181 manufactured by Texas Instruments and others.

Figure 2:
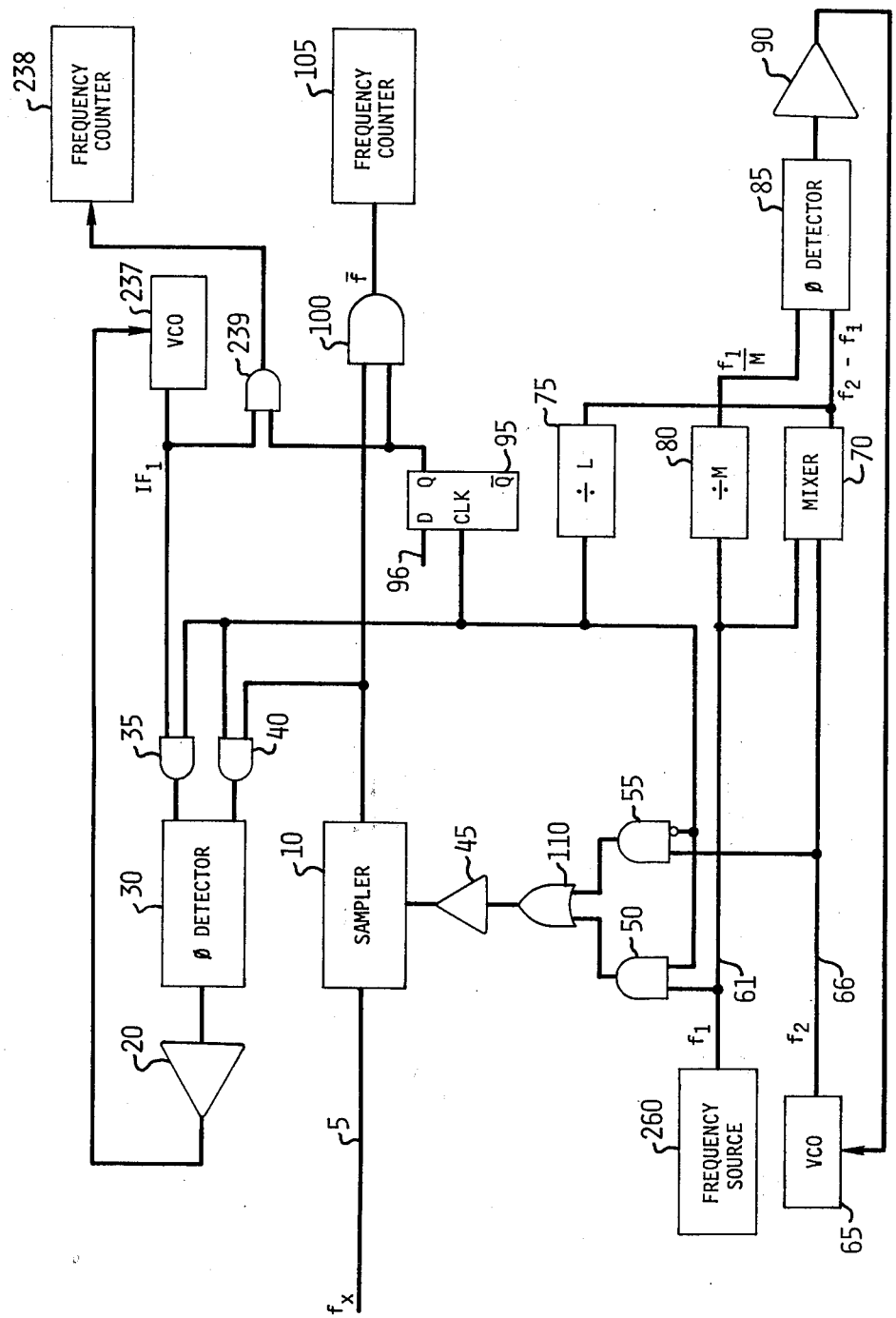
FIG. 2 is a schematic diagram of a frequency measurement system according to another embodiment of the invention.

Referring to the schematic diagram of FIG. 2, there is shown the input signal 5 of unknown frequency $f_x$ input to sampler 10. The sampler is again alternately driven by signals 61 and 66. However, signal 61 is held at a constant frequency $f_1$ by frequency source 260 while voltage controlled oscillator 65 is tuned by the phase lock loop to lock signal 66 of frequency $f_2$ within the desired offset. The upper phase lock loop tunes voltage controlled oscillator 237 so that $IF_1$ is locked to the sampler output whenever signal 61 is utilized as the sampling frequency. The loop is broken, allowing voltage controlled oscillator 237 to coast at the last frequency determined by the phase lock loop, whenever signal 75 toggles to the zero state to select signal 66 as the sampling frequency.

Referring to the schematic diagram of FIG. 2, signal 61 of frequency $f_1$ is generated by oscillator 260 at a known frequency. Signal 66 of frequency $f_2$ is then generated by voltage controlled oscillator 65 which is tuned through loop filter amplifier 90 so that $$f_2 = f_1 (1 + \frac{1}{M}) \qquad (11)$$

as described above in the description of the circuit of FIG. 1. The difference frequency, $f_2 - f_1$, from mixer 70 is coupled to divider 75 which applies signal 76 to gates 50 and 55, thereby alternately coupling signals 61 and 66 to the sampler 10. The output of the sampler is phase continuous since the transition between $f_1$ of signal 61 as the sampling frequency and $f_2$ of signal 66 as the sampling frequency or vice versa only occurs when $f_1$ and $f_2$ are in phase.

When signal 61 is enabled as the sampling signal through gate 50, gate 35 and gate 40 are also enabled by control signal 76. The output from sampler 10 and the output of voltage controlled oscillator 237 are applied to phase detector 30 by filter amplifier 20 to tune voltage controlled oscillator 237 such that $$f_x = Nf_1 - IF_1. \qquad (12)$$

Since $IF_1$ is no longer predetermined, use of the equation $f_x = 2M\overline{f} - (2M +1) IF_1$ to compute $f_x$ requires measurement of the $IF_1$ signal from voltage controlled oscillator 237. This measurement is accomplished by frequency counter 238 when gate 239 is enabled by flip-flop 95.. $f_x$ is then computed from the equation $f_x = 2M\bar{f} - (2M+1) IF_1$ as before.

Figure 3:
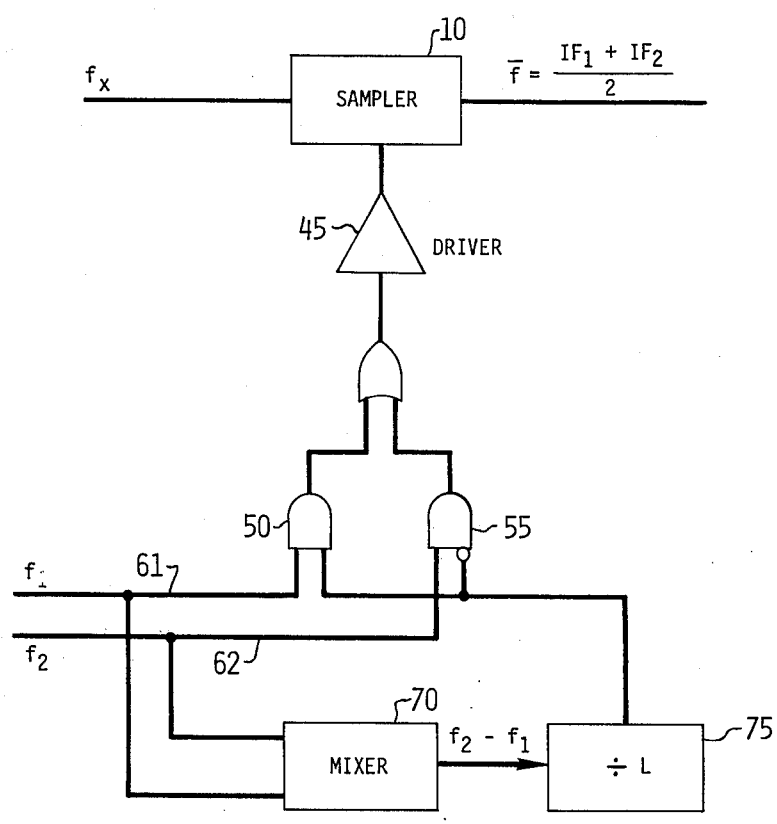
FIG. 3 is a schematic diagram of phase continuous switching apparatus useful for alternating between two sampling frequencies driving a single sampler in the embodiments of FIGS. 1 and 2.

Referring to FIG. 3, the essential apparatus for phase continuous switching has been extracted from the frequency measurement apparatus described above. The mixer 70 indicates the phase relationship of the signals 61 and 66 through transitions of the difference frequency $f_2-f_1$. Use of a filter between mixer 70 and divider 75 to isolate the difference frequency may be required if certain types of mixers are utilized. However, as is generally known, the use of square wave signals for signals 61 and 66 allows the use of a single D flip-flop or series of D flip-flops as mixer 70 to directly provide the difference frequency without additional filtering by applying the two signals of frequencies $f_1$ and $f_2$ to the D and clock inuts. (See e.g. PHASE-LOCKED LOOP SYSTEMS, Motorola Semiconductor Products, Inc., Second Ed., pp. 11-13, August 1973.)

The toggling of the output from divider 75 each L cycles of the difference frequency controls the enabling of gates 50 and 55. Because this toggling only occurs during periods when $f_1$ and $f_2$ are in phase the output of the driver 45 is phase continuous as is the resulting IF output of sampler 10.. Elimination of discontinuities during the transition period permits accurate measurement of the average IF frequency $\bar{f}$ and subsequent use of the measured value for computation of $f_x$. Some implementation details are discussed below which enable one to obtain better performance.

Typically, a finite time (known as set up time) is needed for the D input of a flip-flop used as mixer 70 to settle after a signal is applied before successful clocking can occur. Therefore, the two signals $f_1$ and $f_2$ are not exactly in phase as indicated by the output of mixer 70. By adding a small fixed delay between AND gate 50 and the subsequent OR gate 110 (assuming $f_1$ is connected to the D input), one can compensate for the phase difference due to the set up time.

By making use of the fact that the harmonic number is an integer, refinement of $f_x$ can be obtained. If $f_1$ is known, as in the embodiment of FIG. 2, or measured, then the harmonic number can be computed after $f_x$ is determined by equation (10) by $$N' = \frac{f_x + IF_1}{f_1}. \quad (13)$$

If N' obtained by equation (13) is close to but not equal to an integer, then the expression should be replaced by the nearest integer N $$N = \text{Integer } \left[ \frac{f_x + IF_1}{f_1} \right]. \quad (14)$$

Then an improved $f_x$, called $f_x'$, can be obtained by $$f_x' = \text{Integer } \left[ \frac{f_x + IF_1}{f_1} \right] f_1 - IF_1. \quad (15)$$

To select one IF frequency while suppressing others arising from different harmonic numbers, the sampler outputs (IF signals) are typically bandpass filtered. The presence of filters necessitates more than one pair ($f_1$ and $f_2$) of sampling frequencies to cover all input frequencies within a specific band. In practice, $f_1$ is one of a set of possible frequencies available for band coverage. The choice of a set of sampling frequencies to cover a band consistent with an IF filter is a problem separate from the present invention. Also, equations 1 and 4 assume a specific side band, a completely equivalent system can be constructed using the opposite side band.

I claim:
1. A circuit comprising:
    gating means having inputs for receiving a first signal and a second signal and providing an output signal which is representative of one of the first and second signals in response to a control signal applied thereto;
    a first means coupled to receive said first signal and said second signal for providing a difference frequency signal therefrom; and
    a divider circuit means coupled to the first means for receiving the difference frequency signal and for supplying to the gating means said control signal having two logic states and alternating between said two logic states a selected number of cycles of the difference frequency for controlling the phase continuous switching of the first signal and the second signal by the gating means.

2. The circuit as in claim 1 wherein the first means includes a mixer means.

3. The circuit as in claim 2 wherein the first means further includes a filter means for passing only the difference frequency.

4. The circuit as in claim 2 wherein the mixer includes a D flip-flop.

5. A method of providing phase continuous switching of two signals, which comprises the steps of:
    producing a difference frequency signal from the two signals;
    dividing the difference frequency signal to produce a control signal which has two logic states and which alternates between the two logic states a selected number of cycles of the difference frequency; and
    gating the two signals to provide one signal as an output in reponse to one logic state of the control signal and the other signal as the output in response to the other logic state of the control signal.

6. The method of providing phase continuous switching as in claim 5 wherein the step of producing the difference frequency comprises mixing the two signals to produce the difference frequency signal.

7. The method of providing phase continuous switching as in claim 6 wherein the step of producing the difference frequency signal further comprises the step of filtering the signal produced by mixing to remove signals of other frequencies.

8. An apparatus for frequency measurement of an applied signal including the circuit as in claim 1 and further comprising:
    a first signal controlled oscillator means coupled to the gating means and the first means for providing the first signal;
    a second signal controlled oscillator means coupled to the gating means and the first means for providing the second signal;
    a sampler having an input for receiving an applied signal of unknown frequency, coupled to the gating means for receiving the phase continuous output therefrom and providing an output signal in response thereto;
    a signal generating means for providing a signal of known IF frequency;

an input phase lock loop including the first signal controlled oscillator and loop compensation network means for locking the sampler output to the known IF frequency signal whenever the control signal enables the gating means to output the first signal;

a second phase lock loop including the second signal controlled oscillator and loop compensation network means for locking the second signal to the first signal within a predetermined offset; and frequency counting means coupled to the sampler for receiving the output signal therefrom.

9. The apparatus for frequency measurement as in claim 8, further comprising:

means for calculating the unknown frequency of an applied signal from the value of the known IF frequency and the measured value of the sampler output.

10. An apparatus for frequency measurement of an applied signal including the circuit of claim 1 and further comprising:

a first oscillator means coupled to the gating means and to the first means for providing the first signal thereto;

a second signal controlled oscillator coupled to the gating means and the first means for providing the second signal thereto;

a sampler having an input for receiving an applied signal of unknown frequency coupled to the gating means for receiving the phase continuous output therefrom and providing an output signal in response thereto;

a second phase lock loop including the second signal controlled oscillator and loop compensation network means for locking the second signal to the first signal within a predetermined offset;

an input phase lock loop including a third signal controlled oscillator for providing a third signal and network compensation means coupled to the sampler for receiving said output signal therefrom and coupled to the third signal controlled oscillator for locking the third signal to the sampler output whenever the control signal enables the gating means to output the first signal;

a first frequency counting means coupled to the sampler for receiving the output signal therefrom; and a second frequency counting means coupled to the third signal controlled oscillator for receiving the third signal therefrom.

11. The apparatus for frequency measurement as in claim 10, further comprising:

means coupled to the first and second frequency counting means for calculating the unknown frequency of the applied signal from the measured value of the third signal and the measured value of the sampler output signal.

* * * * *